(12) United States Patent
Wang et al.

(10) Patent No.: US 10,147,643 B2
(45) Date of Patent: Dec. 4, 2018

(54) ARRAY SUBSTRATE, MANUFACTURING METHOD THEREOF, AND DISPLAY DEVICE

(71) Applicants: BOE TECHNOLOGY GROUP CO., LTD., Beijing (CN); BEIJING BOE DISPLAY TECHNOLOGY CO., LTD., Beijing (CN)

(72) Inventors: Shoukun Wang, Beijing (CN); Huibin Guo, Beijing (CN); Yuchun Feng, Beijing (CN); Liangliang Li, Beijing (CN)

(73) Assignees: BOE TECHNOLOGY GROUP CO., LTD., Beijing (CN); BEIJING BOE DISPLAY TECHOLOGY CO., LTD., Beijing (CN)

( * ) Notice: Subject to any disclaimer, the term of this patent is extended or adjusted under 35 U.S.C. 154(b) by 0 days.

(21) Appl. No.: 15/521,079

(22) PCT Filed: Sep. 7, 2016

(86) PCT No.: PCT/CN2016/098352
§ 371 (c)(1),
(2) Date: Apr. 21, 2017

(87) PCT Pub. No.: WO2017/121136
PCT Pub. Date: Jul. 20, 2017

(65) Prior Publication Data
US 2018/0090377 A1    Mar. 29, 2018

(30) Foreign Application Priority Data
Jan. 11, 2016    (CN) .......................... 2016 1 0015755

(51) Int. Cl.
*H01L 21/77* (2017.01)
*H01L 27/12* (2006.01)
(Continued)

(52) U.S. Cl.
CPC ........ *H01L 21/77* (2013.01); *H01L 21/32139* (2013.01); *H01L 27/12* (2013.01); *H01L 27/14* (2013.01)

(58) Field of Classification Search
CPC .... H01L 21/77; H01L 21/32139; H01L 27/14
See application file for complete search history.

(56) References Cited

U.S. PATENT DOCUMENTS

2006/0243979 A1    11/2006  Park et al.
2015/0198853 A1*   7/2015  Park ...................... H01L 27/124
                                                    349/137

FOREIGN PATENT DOCUMENTS

CN    1858911 A     11/2006
CN    101330106 A   12/2008
(Continued)

OTHER PUBLICATIONS

International Search Report and Written Opinion dated Dec. 15, 2016; PCT/CN2016/098352.
(Continued)

*Primary Examiner* — Selim Ahmed
(74) *Attorney, Agent, or Firm* — Ladas & Parry LLP

(57) ABSTRACT

An array substrate, a manufacturing method thereof, and a display device are provided. The array substrate includes: a base substrate, a signal line disposed on the base substrate, an extinction layer disposed between the base substrate and the signal line, the extinction layer being configured to reduce an ambient light when the array substrate is located on a light exiting side. An orthographic projection of the signal line in a plane of the base substrate is coincided with an orthographic projection of the extinction layer in the plane of the base substrate.

13 Claims, 6 Drawing Sheets

(51) Int. Cl.
*H01L 21/3213* (2006.01)
*H01L 27/14* (2006.01)

(56) References Cited

FOREIGN PATENT DOCUMENTS

| | | |
|---|---|---|
| CN | 103185978 A | 7/2013 |
| CN | 105470268 A | 4/2016 |

OTHER PUBLICATIONS

The First Chinese Office Action dated Dec. 5, 2017; Appln. No. 201610015755.8.

\* cited by examiner

ARRAY SUBSTRATE, MANUFACTURING METHOD THEREOF, AND DISPLAY DEVICE

TECHNICAL FIELD

Embodiments of the present disclosure relate to an array substrate, a method for manufacturing the same, and a display device.

BACKGROUND

In a common display panel, an array substrate of a thin film transistor (TFT) is located in a lower layer and a color film substrate is located in an upper layer. To realize a narrow frame or even a frameless design, the TFT array substrate is disposed in the upper layer of the display panel, and the color film substrate is disposed in the lower layer of the display panel, so that the frame of the conductive end bonded with the PCB circuit board can be significantly narrowed, or even no frame.

SUMMARY

Embodiments of the present disclosure provide an array substrate, a method for manufacturing the same, and a display device.

According to at least one embodiment of the present disclosure, an array substrate is provided. The array substrate includes: a base substrate; a signal line disposed on the base substrate; and an extinction layer disposed between the base substrate and the signal line, the extinction layer being configured to reduce an ambient light entering the signal line when the array substrate is located on a light exiting side. An orthographic projection of the signal line in a plane of the base substrate is coincided with an orthographic projection of the extinction layer in the plane of the base substrate.

For example, the extinction layer includes amorphous silicon or semiconductor mixture doped with amorphous silicon.

For example, the extinction layer has a thickness satisfying an interference extinction formula:

$$d = (2n+1)\lambda/4N \quad (1),$$

where d is a thickness of the extinction layer, $\lambda$ is a wavelength of the visible light in the air, N is a refractive index of the extinction layer, n is a natural number.

For example, the thickness of the extinction layer is 340 Å.

For example, a plurality of protrusion structures are disposed on at least one surface of the extinction layer.

For example, a plurality of protrusion structures are disposed on two surfaces of the extinction layer.

For example, the signal line is a gate line, or a common electrode line.

According to an embodiment of the present disclosure, a display device is also provided, including the array substrate, the array substrate being located on a light exiting surface of the display device.

According to an embodiment of the present disclosure, a method for manufacturing an array substrate is also provided, including: providing a base substrate.

For example, the method further includes: sequentially depositing an extinction layer and a metal layer on a surface of the base substrate; etching the metal layer by a mask, and forming a patterned signal line; and etching the extinction layer by using a pattern of the signal line, and forming a patterned extinction layer which has the same pattern as the patterned signal line.

For example, the method further includes: before sequentially depositing the extinction layer and the metal layer on the surface of the base substrate, placing the base substrate in a vacuum chamber, and performing a roughening treatment to a surface of the base substrate by a plasma gas, to allow a plurality of protrusion structures to be formed on a surface of a subsequently formed extinction layer near the base substrate.

For example, the method for manufacturing the array substrate further includes: depositing an extinction layer on a surface of the base substrate; placing the base substrate deposited with the extinction layer in a vacuum chamber, and performing a roughening treatment to the extinction layer by a plasma gas, to allow a plurality of protrusion structures to be formed on the extinction layer; and depositing a metal layer on the roughening treated extinction layer.

BRIEF DESCRIPTION OF THE DRAWINGS

Embodiments of the present disclosure will be described in more detail below with reference to accompanying drawings to allow an ordinary skill in the art to more clearly understand embodiments of the present disclosure, in which.

DETAILED DESCRIPTION

Technical solutions according to the embodiments of the present disclosure will be described clearly and fully as below in conjunction with the accompanying drawings of embodiments of the present disclosure. It is apparent that the described embodiments are just a part but not all of the embodiments of the disclosure. Based on the described embodiments herein, a person of ordinary skill in the art can obtain other embodiment(s), without any creative work, which shall be within the scope of the present disclosure.

The inventors found that, for a narrow frame or a frameless design, it is equivalent to inverting the current display panel, so that the TFT array substrate is close to the light exiting side. But in this arrangement, metal signal lines in the TFT array substrate and the gate lines would reflect the ambient light. Particularly when the ambient light is strong, the reflection of light exiting surface is even more severe, so that it would result in a poor contrast of the display panel, and the display effect is affected.

The embodiments of the present disclosure include, but are not limited to the following examples, which are described in detail.

Figure 1:
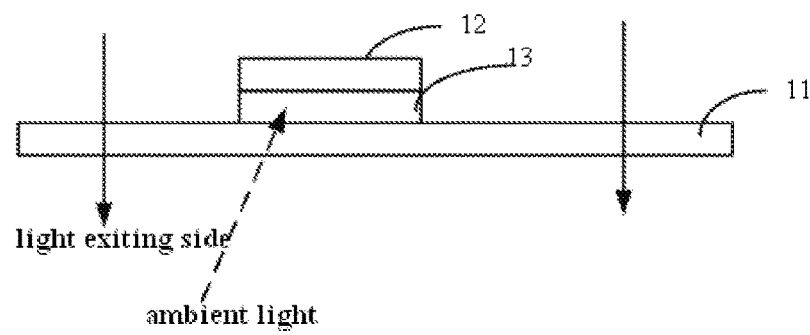
FIG. 1 is a schematic structural view of an array substrate according to an embodiment of the present disclosure.

FIG. 1 is a schematic structural view of an array substrate according to an embodiment of the present disclosure. The array substrate mainly includes: a base substrate 11, a signal line 12 disposed on the base substrate 11. The array substrate further includes an extinction layer 13 disposed between the base substrate 11 and the signal line 12, and the extinction layer 13 is configured to reduce an ambient light entering the signal line 12 when the array substrate is located on a light exiting side. An orthographic projection of the signal line 12 in a plane of the base substrate is coincided with an orthographic projection of the extinction layer 13 in the plane of the base substrate.

The extinction layer provided in the present embodiment is capable of reducing a portion of the ambient light, and the ambient light entering the signal line is reduced, correspondingly, the reflected light by the signal line is reduced. The problem of a decreased display contrast has been avoided, which is caused by the reflection of the ambient light by the signal line.

In addition, the array substrate further includes: a TFT device, a data line, a via hole, a pixel electrode, or the like. They are not shown in the drawings, and they are not described herein in detail.

To solve a problem that the display contrast in the frameless display panel is decreased by the reflection of ambient light by the signal line, for example, in the described array substrate of the present embodiment of the present disclosure, the extinction layer is disposed between the base substrate and the signal line, and is configured to reduce the ambient light entering the signal line when the array substrate is located on a light exiting side, so that it can eliminate the reflection and visual exposure when the signal line is close to the light exiting side. In the present embodiment, the ambient light entering the signal line is decreased by decreasing the ambient light by the extinction layer, to allow the ambient light reflected by the signal line to be decreased, and the display contrast of the display panel is improved. Furthermore, the orthographic projection of the extinction layer in the plane of the base substrate is coincided with the orthographic projection of the signal line in the plane of the base substrate, that is, the pattern of the extinction layer is the same as the pattern of the signal line, so that it will not affect the transmittance of the display panel. The display contrast is enhanced, while the transmittance of the display panel is ensured, and the display image quality is improved.

For example, to better reduce the ambient light entering the display panel, darker amorphous silicon, or semiconductor mixture doped with amorphous silicon may be selected for the material of the extinction layer, however, the embodiments of the present disclosure are not limited thereto.

In the embodiments of the present disclosure, the extinction layer of these materials can effectively avoid the problem of the decreased display contrast caused by the reflection of the ambient light by the signal line.

In embodiments of the present disclosure, the extinction layer can reduce the ambient light by ways below, for example.

Way I: Interference Extinction Principle

Since lights with various wavelengths can be extinct in some certain interference extinction condition, in the embodiments of the present disclosure, the thickness of the extinction layer satisfies the following interference extinction formula:

$$d=(2n+1)\lambda/4N \quad (1),$$

where d is the thickness of the extinction layer, $\lambda$ is the wavelength of the visible light in the air, N is the refractive index of the extinction layer, n is a natural number.

In the embodiments of the present disclosure, the extinction layer with the thickness defined in the interference extinction principle can reduce the ambient light, and can effectively avoid the problem of the decreased display contrast caused by the reflection of the ambient light from the signal line.

For example, the visible light has wavelength $\lambda$ in a range from 350 nm to 770 nm; and the value of n is any natural number. For the ambient light, its wavelength can be the average value of the wavelength of the visible light, for example, about 550 nm. Considering the restriction to the thickness of the display panel, that is, to meet the requirement of thinner and lighter design for the display panel, the value of n is, for example, 0. In this way, when the wavelength $\lambda$ is 550 nm, n is 0, and the refractive index of the extinction layer is 4, the thickness of the extinction layer is about 340 Å. That is, the extinction layer with this thickness satisfies the interference extinction conditions, when the ambient light enters the array substrate, an interference extinction phenomenon can be occurred in the extinction layer, so that the ambient light entering the signal line is reduced or even avoided, and the light reflected by the signal line to human eyes would be reduced, as well as the display contrast of the display panel is enhanced. Furthermore, the pattern of the extinction layer is the same as the pattern of the signal line, the transmittance of the region where the signal line is not located would not be affected, and the display effect is improved as a whole.

The extinction layer provided in the present embodiment is capable of reducing a portion of the ambient light, and the ambient light entering the signal line is decreased, correspondingly, the reflected light from the signal line is reduced. In this way, the problem of the decreased display contrast can be avoided, which is caused by the reflection of the ambient light by the signal line.

Way II: Diffuse Reflection Principle

Figure 2A:
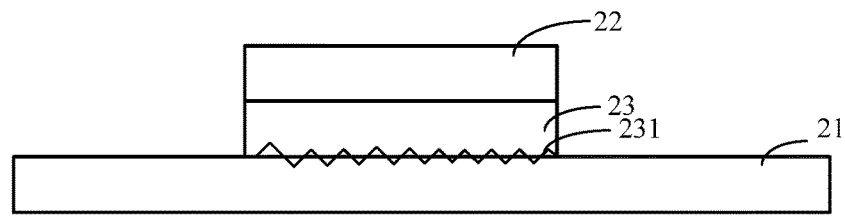
FIGS. 2(a)-2(c) are schematic structural views of three types of extinction layers, respectively.

In a frameless design, the main reason for the decreased contrast is that the signal line is often made of a metal and has a smooth surface, a mirror reflection to the entering light occurs easily. As illustrated in FIG. 2(a), according to an embodiment of the present disclosure, to avoid the problem, an extinction layer is disposed between the signal line 22 and the base substrate 21, and a plurality of protrusion structures 231 are disposed on at least one surface of the extinction layer 23. A shape of the protrusion structure 231 may be triangular, trapezoidal or irregular, and the shapes of the plurality of protrusion structures may be same, or different, however, the embodiments of the present disclosure are not limited thereto. The structure of the extinction layer may include types below, For example.

Figure 2B:
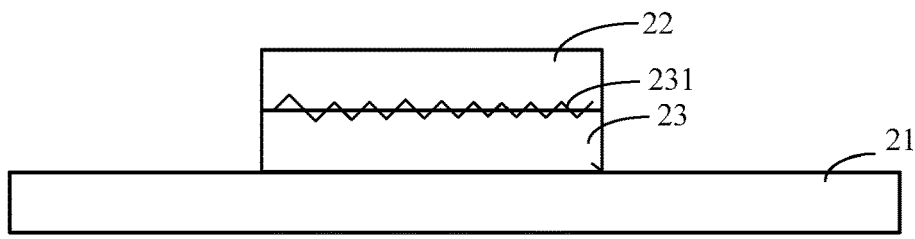
Figure 2C:
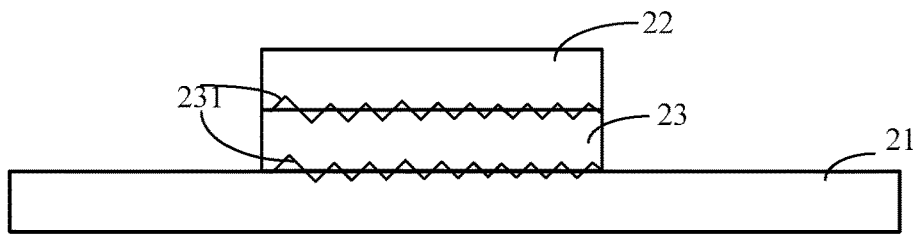

Type I: a plurality of protrusion structures 231 are disposed on the surface of the extinction layer 23 near the signal line 22, as illustrated in FIG. 2(a);

Type II: a plurality of protrusion structures 231 are disposed on the surface of the extinction layer 23 away from the signal line 22, as illustrated in FIG. 2(b);

Type III: a plurality of protrusion structures 231 are disposed on both surfaces of the extinction layer 23, as illustrated in FIG. 2(c);

Embodiments of the present disclosure are not limited to the above described ways and types.

No matter which one of the above types is selected, the presence of a plurality of protrusion structures allows a rough surface of the extinction layer, so that it is easy to diffuse the ambient light entering the extinction layer. In this way, the light entering the signal line is reduced, and the light reflected by the signal line to human eyes is reduced, thus the display contrast of the display panel is enhanced. Furthermore, the pattern of the extinction layer is the same as the pattern of the signal line, the transmittance of the region, where the signal line is not located, would not be affected, and the display effect is improved as a whole.

In an embodiment of the present disclosure, to enhance the diffuse reflection effect, for example, the extinction layer of type III is used.

For example, the signal line provided in embodiments of the present disclosure is a gate line, or a common electrode line, furthermore, both the gate line and the common electrode line may be similarly provided.

Figure 3:
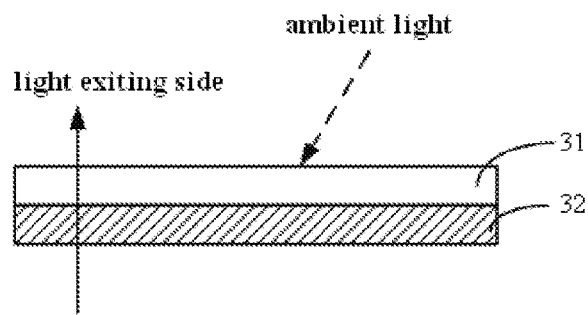
FIG. 3 is a schematic structural view of a display device according to an embodiment of the present disclosure.

Meanwhile, a display device is also provided in embodiments of the present disclosure. For example, a frameless display device is provided, as illustrated in FIG. 3, the display device includes the array substrate 31 described in above embodiments, and a color film substrate 32 disposed oppositely. The array substrate 31 is located on a light exiting surface of the display device. Since the extinction layer is disposed on the array substrate of the display device, while realizing a frameless design, it is also possible to reduce the ambient light entering the signal line by reducing the ambient light, so that the ambient light reflected by the signal line is reduced. The display contrast is enhanced, and the display quality of the display device is improved.

The extinction layer provided in the present embodiment is capable of reducing a portion of the ambient light to allow the ambient light entering the signal line to be decreased, and the reflected light by the signal line is decreased, correspondingly. The problem of the decreased display contrast is avoided, which is caused by the reflection of the ambient light by the signal line.

With the same conception as the array substrate provided in embodiments of the present disclosure, a method for manufacturing the array substrate is also provided in embodiments of the present disclosure, which is described in detail in the following embodiments.

Figure 4:
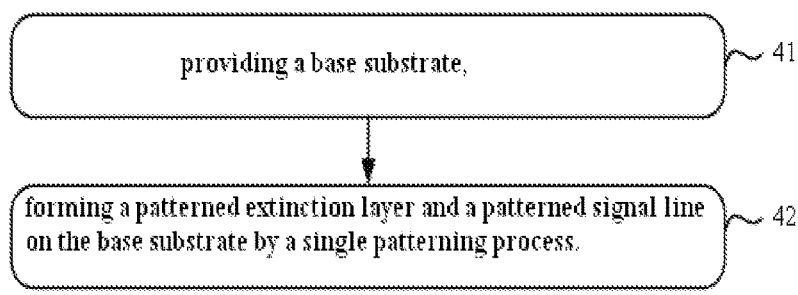
FIG. 4 is a flow diagram of a manufacturing method for an array substrate according to an embodiment of the present disclosure.

FIG. 4 is a flow chart of manufacturing method for an array substrate according to an embodiment of the present disclosure, which includes following steps.

Step 41: providing a base substrate.

Step 42: forming a patterned extinction layer and a patterned signal line on the base substrate by a single patterning process.

In this embodiment, the patterned extinction layer and the patterned signal line are formed on the base substrate by a single patterning process. In this way, the extinction layer and the signal line can be formed by a single patterning process in the present embodiment, and the process is saved and simplified. Meanwhile, the structure of the produced array substrate can avoid the problem that the display contrast is decreased, which is caused by the reflection of the ambient light by the signal line.

In addition, the method for manufacturing the array substrate can further include processes of forming a TFT device, an insulating layer and a pixel electrode, these processes can be performed routinely.

For example, the step 42 includes the following steps.

421: sequentially depositing an extinction layer and a metal layer on a surface of the base substrate.

Figure 5A:
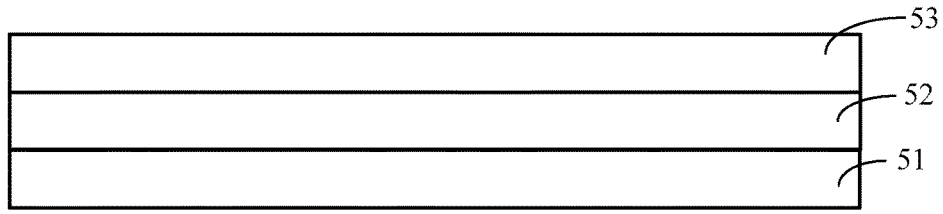
FIGS. 5(a)-5(e) are process flow diagrams of step 42 according to an embodiment of the present disclosure.

For example, the extinction layer 52 and the metal layer 53 are deposited on a surface of the base substrate 51 by a physical vapor deposition process, or a chemical vapor deposition process, as illustrated in FIG. 5(a); the extinction layer can be formed by darker amorphous silicon, or semiconductor mixture doped with amorphous silicon. The material of the metal layer is a metal, or metal mixture, such as copper, silver, nickel, or the like, however, the embodiments of the present disclosure are not limited thereto.

422: etching the metal layer by a photolithography process with a mask, and forming a patterned signal line.

Figure 5B:
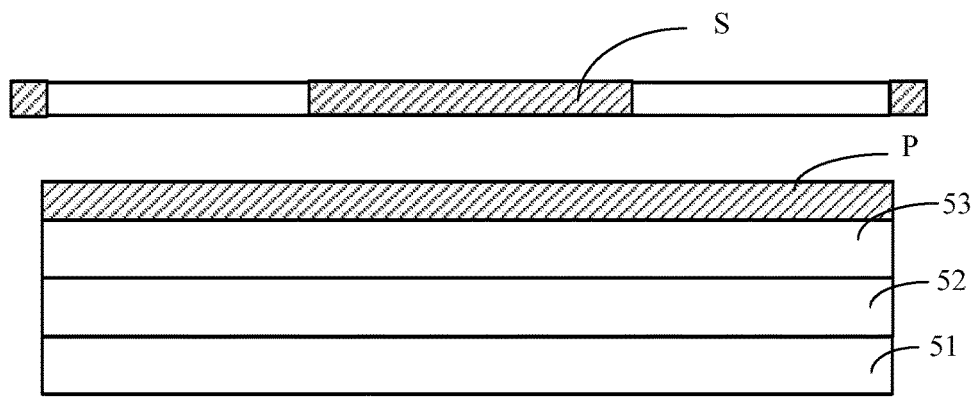
Figure 5C:
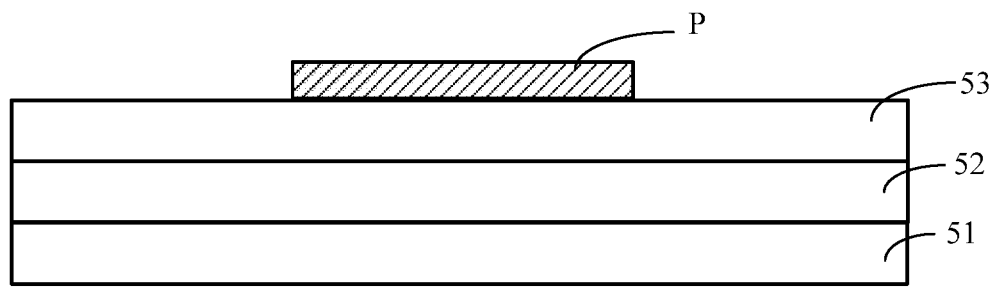
Figure 5D:
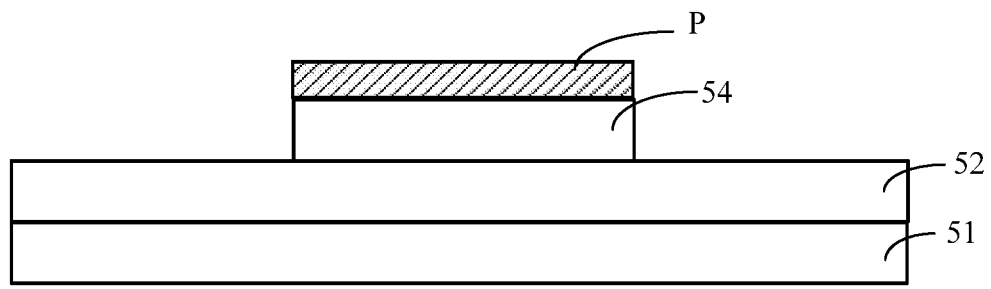

For example, firstly, as illustrated in FIGS. 5(b) and 5(c), a photoresist P (such as a positive photoresist) with a thickness is applied on the metal layer 53; secondly, the metal layer 53 is exposed and developed by the mask S, and the dissolved photoresist after being developed is peeled off; finally, as illustrated in FIG. 5(d), a part of the metal layer 53 on which the photoresist is peeled off is etched, and the patterned signal line 54 is formed on the other part of the metal layer on which the photoresist is retained.

423: etching the extinction layer by using the pattern of the signal line, and forming a patterned extinction layer which has the same pattern as the patterned signal line.

Figure 5E:
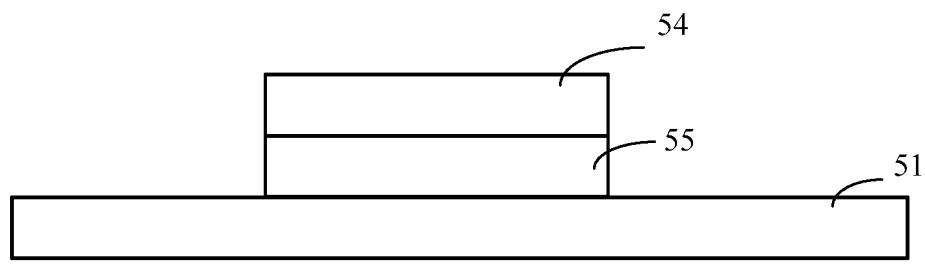

In this step, since the signal line 54 has been patterned and the pattern of the extinction layer 55 is the same as the pattern of the signal line 54, there is no need for an additional patterning process for the extinction layer, but masking the extinction layer by using the formed pattern of the signal lines, so as to etch the exposed region of the extinction layer and form the patterned extinction layer 55 which has the same pattern as the patterned signal line, as illustrated in FIG. 5(e).

According to the embodiment of the present disclosure, the pattern of the extinction layer is the same as the pattern of the signal line, it is not necessary to pattern the extinction layer and the signal line separately, the extinction layer and the signal line can be formed by a single patterning process. In this way, the process is saved and simplified. In addition, the extinction layer capable of reducing the ambient light is formed, so that the ambient light entering the signal line is reduced. Further, the light reflected by the signal line is reduced, and the contrast of the display device subsequently fabricated is enhanced.

In the embodiments of the present disclosure, based on the above manufacturing approaches, examples are provided below.

Example 1

Figure 6:
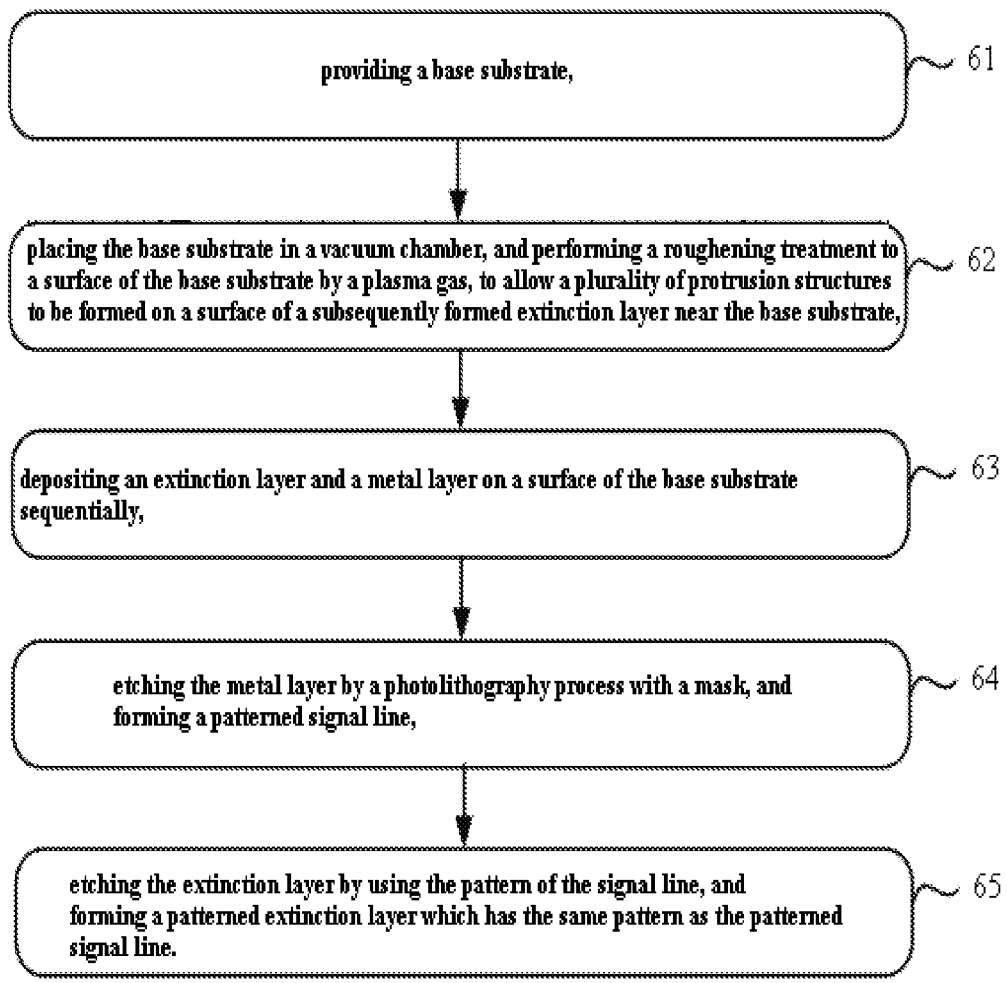
FIG. 6 is a flow chart of a manufacturing method for an array substrate according to example 1 of the present disclosure.

FIG. 6 is a flow chart of a manufacturing method for an array substrate according to example 1 of the present disclosure, which mainly includes:

Step 61: providing a base substrate.

Step 62: placing the base substrate in a vacuum chamber, and performing a roughening treatment to a surface of the base substrate by a plasma gas, to allow a plurality of protrusion structures to be formed on a surface of a subsequently formed extinction layer near the base substrate.

For example, in the present embodiment, after the base substrate is placed in the vacuum chamber, the surface of the base substrate is bombarded with the plasma gases, such as $SF_6$, $O_2$, or the like, to allow the surface to be roughened.

Step 63: depositing an extinction layer and a metal layer on a surface of the base substrate sequentially.

Step 64: etching the metal layer by a photolithography process with a mask, and forming a patterned signal line.

Step 65: etching the extinction layer by using the pattern of the signal line, and forming a patterned extinction layer which has the same pattern as the patterned signal line.

In this technical proposal, with the help of the roughened surface of the base substrate, a plurality of protrusion structures are formed on the surface of the extinction layer near the base substrate, while the extinction layer is deposited.

Example 2

Figure 7:
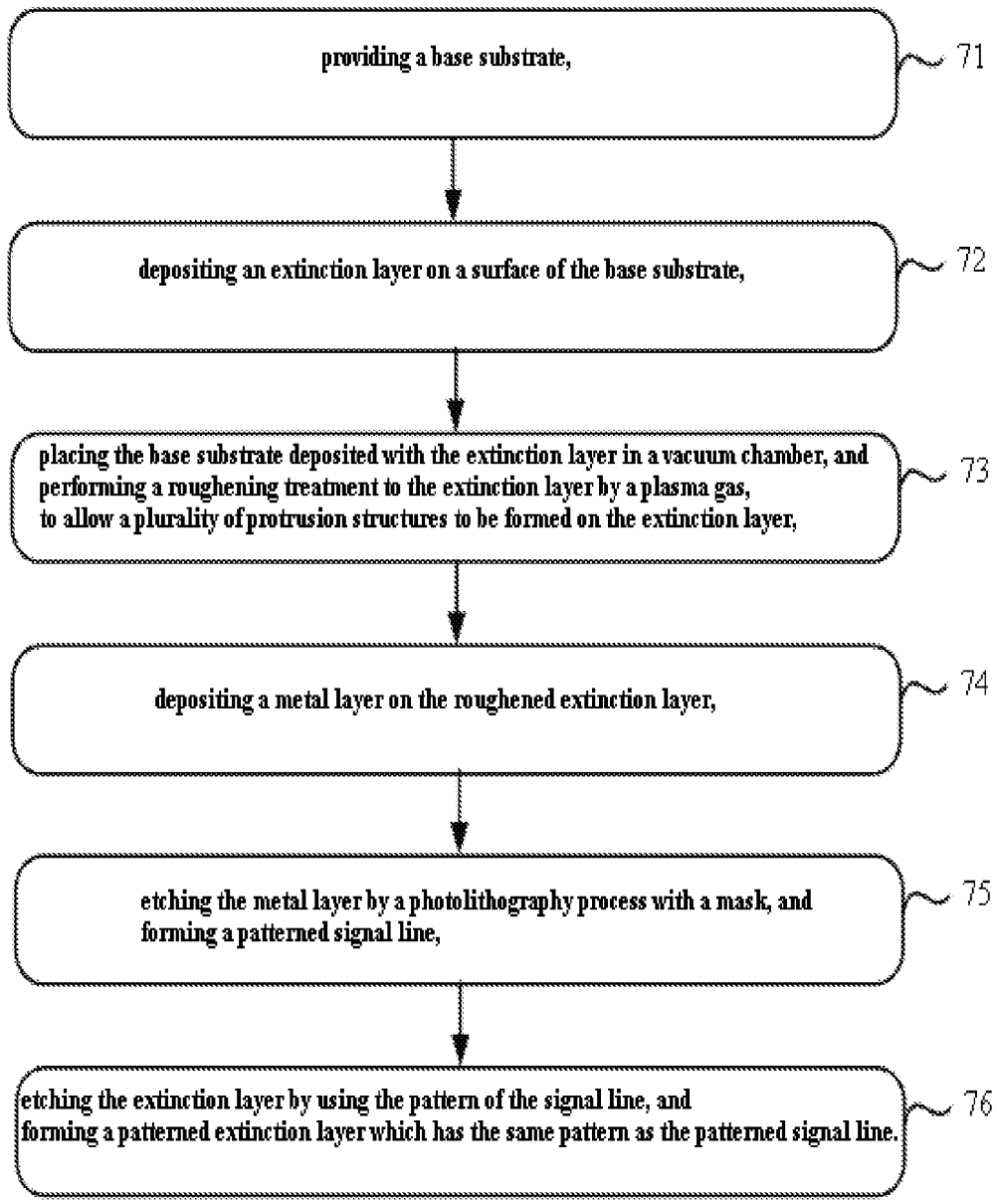
FIG. 7 is a flow chart of a manufacturing method for an array substrate according to example 2 of the present disclosure.

FIG. 7 is a flow chart of a manufacturing method for an array substrate according to example 2 of the present disclosure, which mainly includes:

Step 71: providing a base substrate.

Step 72: depositing an extinction layer on a surface of the base substrate.

Step 73: placing the base substrate deposited with the extinction layer in a vacuum chamber, and performing a roughening treatment to the extinction layer by a plasma gas, to allow a plurality of protrusion structures to be formed on the extinction layer.

Step 74: depositing a metal layer on the roughened extinction layer.

Step 75: etching the metal layer by a photolithography process with a mask, and forming a patterned signal line.

Step 76: etching the extinction layer by using the pattern of the signal line, and forming a patterned extinction layer which has the same pattern as the patterned signal line.

In this technical proposal, after depositing the extinction layer, the surface of the extinction layer away from the base substrate is roughened, that is, a plurality of protrusion structures is formed.

Example 3

Figure 8:
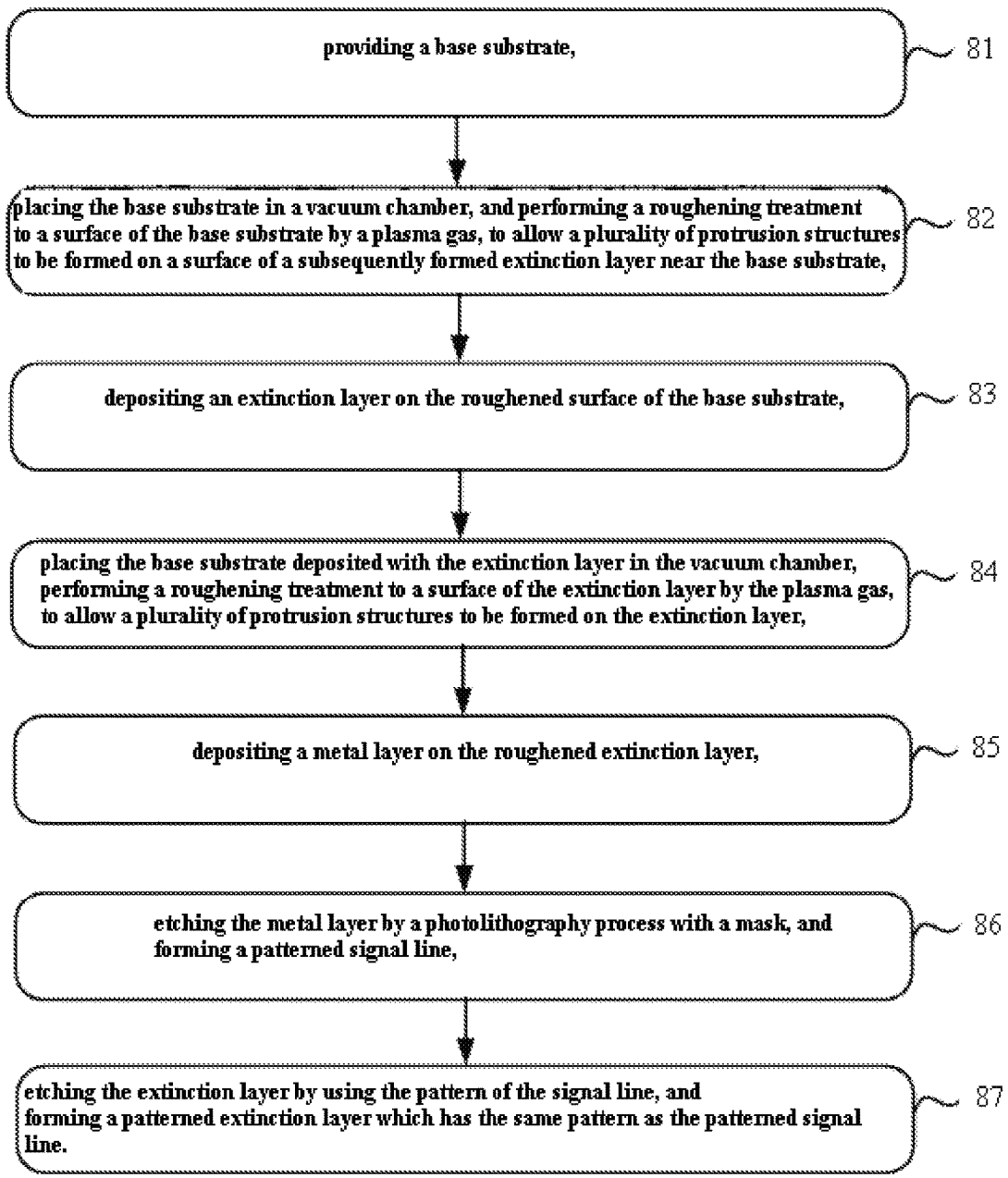
FIG. 8 is a flow chart of a manufacturing method for an array substrate according to example 3 of the present disclosure.

FIG. 8 is a flow chart of a manufacturing method for an array substrate according to example 3 of the present disclosure, which mainly includes:

Step 81: providing a base substrate.

Step 82: placing the base substrate in a vacuum chamber, and performing a roughening treatment to a surface of the base substrate by a plasma gas, to allow a plurality of protrusion structures to be formed on a surface of a subsequently formed extinction layer near the base substrate.

Step 83: depositing an extinction layer on the roughened surface of the base substrate.

Step 84: placing the base substrate deposited with the extinction layer in the vacuum chamber, performing a roughening treatment to a surface of the extinction layer by the plasma gas, to allow a plurality of protrusion structures to be formed on the extinction layer.

Step 85: depositing a metal layer on the roughened extinction layer.

Step 86: etching the metal layer by a photolithography process with a mask, and forming a patterned signal line.

Step 87: etching the extinction layer by using the pattern of the signal line, and forming a patterned extinction layer which has the same pattern as the patterned signal line.

In the technical solution of example 3, on the one hand, with the help of the roughened surface of the base substrate, a plurality of protrusion structures are formed on the surface of the extinction layer near the base substrate, while the extinction layer is deposited; on the other hand, the surface of the extinction layer away from the base substrate is roughened, to allow a plurality of protrusion structures to be formed. The embodiments of the present disclosure are not limited thereto.

The described above are only exemplary embodiments of the present disclosure, and the present disclosure is not intended to be limited thereto. For one of ordinary skill in the art, various changes and alternations may be made without departing from the technical scope of the present disclosure, and all of these changes and alternations shall fall within the scope of the present disclosure.

The present application claims the priority to the Chinese patent application No. 201610015755.8 entitled "Array Substrate, Manufacturing Method Thereof, and Display Device" filed on Jan. 11, 2016, which is incorporated herein in its entirety by reference.

What is claimed is:

1. An array substrate, comprising:
    a base substrate;
    a signal line disposed on the base substrate; and
    an extinction layer disposed between the base substrate and the signal line, the extinction layer including two opposite surfaces, a plurality of protrusion structures are disposed on the two opposite surfaces of the extinction layer, and the extension layer being configured to reduce an ambient light entering the signal line when the array substrate is located on a light exiting side,
    wherein an orthographic projection of the signal line in a plane of the base substrate is coincided with an orthographic projection of the extinction layer in the plane of the base substrate.

2. The array substrate according to claim 1, wherein a material of the extinction layer comprises amorphous silicon or semiconductor mixture doped with amorphous silicon.

3. The array substrate according to claim 1, wherein the extinction layer has a thickness satisfying an interference extinction formula:

$$d=(2n+1)\lambda/4N \qquad (1)$$

where d is a thickness of the extinction layer, $\lambda$ is a wavelength of the visible light in the air, N is a refractive index of the extinction layer, n is a natural number.

4. The array substrate according to claim 3, wherein the thickness of the extinction layer is 340 Å.

5. The array substrate according to claim 1, wherein the signal line is a gate line, or a common electrode line.

6. A display device, comprising the array substrate according to claim 1, wherein the array substrate is located on a light exiting surface of the display device.

7. The array substrate according to claim 2, wherein the extinction layer has a thickness satisfying an interference extinction formula:

$$d=(2n+1)\lambda/4N \qquad (1)$$

where d is a thickness of the extinction layer, $\lambda$ is a wavelength of the visible light in the air, N is a refractive index of the extinction layer, n is a natural number.

8. The array substrate according to claim 7, wherein the thickness of the extinction layer is 340 Å.

9. A method for manufacturing an array substrate, comprising:
    providing a base substrate; and
    forming a patterned extinction layer and a patterned signal line on the base substrate by a single patterning process, the patterned extinction layer including two opposite surfaces;

wherein the forming of the patterned extinction layer includes forming a plurality of protrusion structures on the two opposite surfaces of the extinction layer.

10. The method for manufacturing the array substrate according to claim 9, further comprising:
   sequentially depositing an extinction layer and a metal layer on a surface of the base substrate;
   etching the metal layer by a mask, and forming a patterned signal line; and
   etching the extinction layer by using a pattern of the signal line, and forming a patterned extinction layer which has the same pattern as the patterned signal line.

11. The method for manufacturing the array substrate according to claim 10, further comprising:
   placing the base substrate in a vacuum chamber, and performing a roughening treatment to a surface of the base substrate by a plasma gas, to allow a plurality of protrusion structures to be formed on a surface of a subsequently formed extinction layer near the base substrate.

12. The method for manufacturing the array substrate according to claim 10, further comprising:
   depositing an extinction layer on a surface of the base substrate;
   placing the base substrate deposited with the extinction layer in a vacuum chamber, and performing a roughening treatment to the extinction layer by a plasma gas, to allow a plurality of protrusion structures to be formed on the extinction layer; and
   depositing a metal layer on the roughening treated extinction layer.

13. The method for manufacturing the array substrate according to claim 11, further comprising:
   depositing an extinction layer on a surface of the base substrate;
   placing the base substrate deposited with the extinction layer in a vacuum chamber, and performing a roughening treatment to the extinction layer by a plasma gas, to allow a plurality of protrusion structures to be formed on the extinction layer; and
   depositing a metal layer on the roughening treated extinction layer.

* * * * *